United States Patent
Yeh et al.

(10) Patent No.: US 10,290,681 B2
(45) Date of Patent: May 14, 2019

(54) ARRAY OF HOLE-TYPE SURROUND GATE VERTICAL FIELD EFFECT TRANSISTORS AND METHOD OF MAKING THEREOF

(71) Applicant: SANDISK TECHNOLOGIES LLC, Plano, TX (US)

(72) Inventors: Chao Feng Yeh, Yokkaichi (JP); Jongsun Sel, Los Gatos, CA (US); Zhen Chen, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/711,075

(22) Filed: Sep. 21, 2017

(65) Prior Publication Data

US 2019/0088717 A1    Mar. 21, 2019

(51) Int. Cl.
*H01L 29/792* (2006.01)
*H01L 27/24* (2006.01)
*H01L 45/00* (2006.01)

(52) U.S. Cl.
CPC ...... *H01L 27/2454* (2013.01); *H01L 27/2463* (2013.01); *H01L 45/1206* (2013.01); *H01L 45/1233* (2013.01); *H01L 45/16* (2013.01)

(58) Field of Classification Search
CPC ........... H01L 27/1157; H01L 27/11582; H01L 21/28282; H01L 21/28273; H01L 29/7926; H01L 27/11556; H01L 27/11565; H01L 27/10876; H01L 29/7827; H01L 29/4236; H01L 29/7889; H01L 29/7813

See application file for complete search history.

(56) References Cited

U.S. PATENT DOCUMENTS

| | | | |
|---|---|---|---|
| 5,915,167 A | 6/1999 | Leedy | |
| 7,701,746 B2 | 4/2010 | Meeks et al. | |
| 7,764,534 B2 | 7/2010 | Thorp et al. | |
| 9,331,088 B2 | 5/2016 | Takaki | |

(Continued)

FOREIGN PATENT DOCUMENTS

WO    WO 2007/004843 A1    1/2007

OTHER PUBLICATIONS

U.S. Appl. No. 15/400,244, filed Jan. 6, 2017, SanDisk Technologies LLC.

(Continued)

*Primary Examiner* — Caridad Everhart
(74) *Attorney, Agent, or Firm* — The Marbury Law Group, PLLC

(57) ABSTRACT

Doped semiconductor strips, a planar insulating spacer layer, a gate conductor material layer, and a dielectric cap layer are formed over a substrate. A two-dimensional array of openings is formed through the dielectric cap layer and the gate electrode material layer. Gate dielectrics are formed in the two-dimensional array of openings, and vertical semiconductor channels are formed on each of the gate dielectrics. Gate divider rail structures are formed through the gate conductor material layer. The gate divider rail structures divide the gate conductor material layer into a one-dimensional array of gate electrode lines. Each of the gate electrode lines includes a one-dimensional array of openings arranged along a horizontal direction to form a two-dimensional array of hole-type surrounding gate vertical field effect transistors.

18 Claims, 21 Drawing Sheets

(56) References Cited

U.S. PATENT DOCUMENTS

| | | |
|---|---|---|
| 9,343,507 B2 | 5/2016 | Takaki |
| 9,437,658 B2 | 9/2016 | Sakotsubo |
| 9,583,615 B2 | 2/2017 | Chen et al. |
| 2012/0068255 A1* | 3/2012 | Lee .................. H01L 27/11582 257/324 |
| 2013/0043455 A1 | 2/2013 | Bateman |
| 2016/0315095 A1* | 10/2016 | Sel .......................... H01L 29/04 |
| 2017/0141161 A1 | 5/2017 | Sakotsubo |
| 2018/0175050 A1* | 6/2018 | Son .................. H01L 27/11556 |

OTHER PUBLICATIONS

U.S. Appl. No. 15/632,773, filed Jun. 26, 2017, SanDisk Technologies LLC.
U.S. Appl. No. 15/633,092, filed Jun. 26, 2017, SanDisk Technologies LLC.
U.S. Appl. No. 15/672,929, filed Aug. 9, 2017, SanDisk Technologies LLC.
Endoh et al., "Novel Ultra High Density Memory with a Stacked-Surrounding Gate Transistor (S-SGT) Structured Cell," IEDM Proc., (2001), 33-36.

* cited by examiner

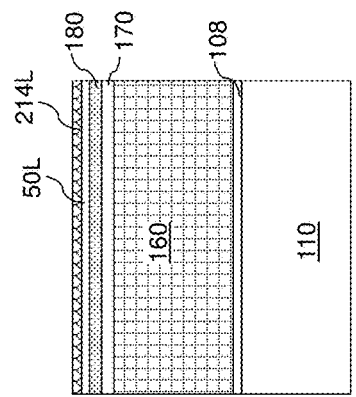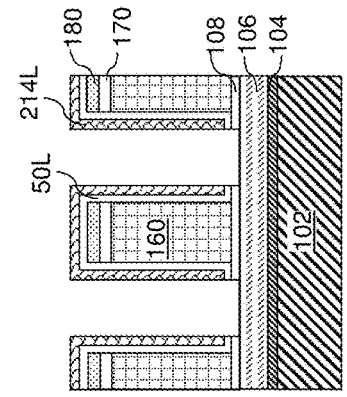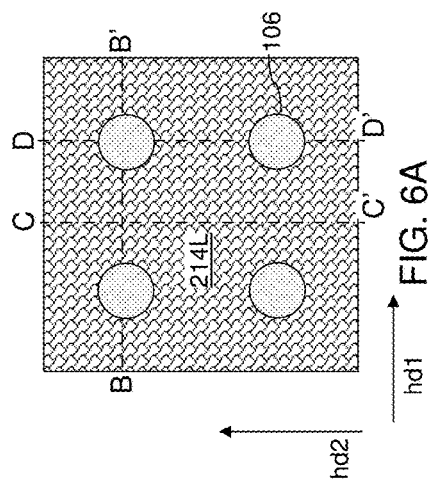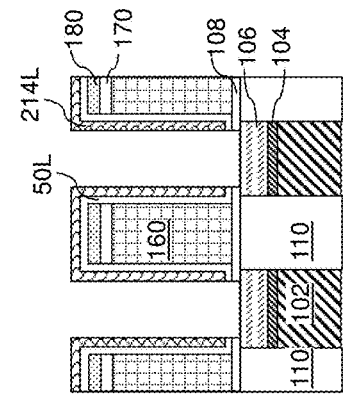

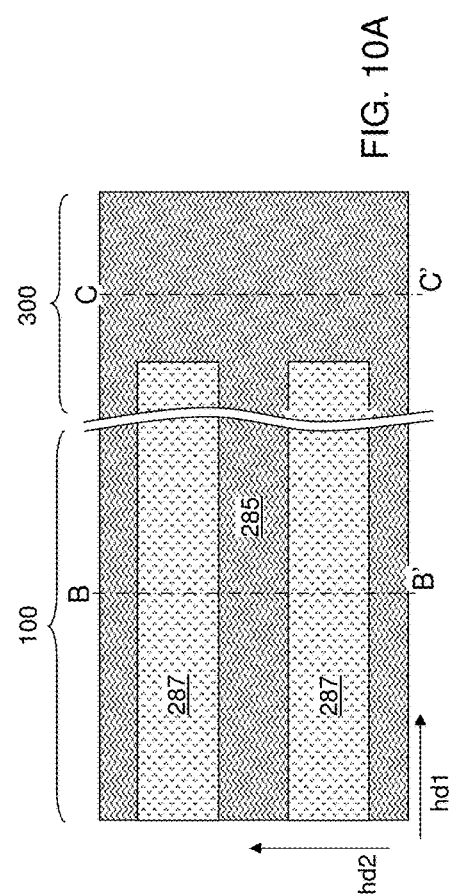
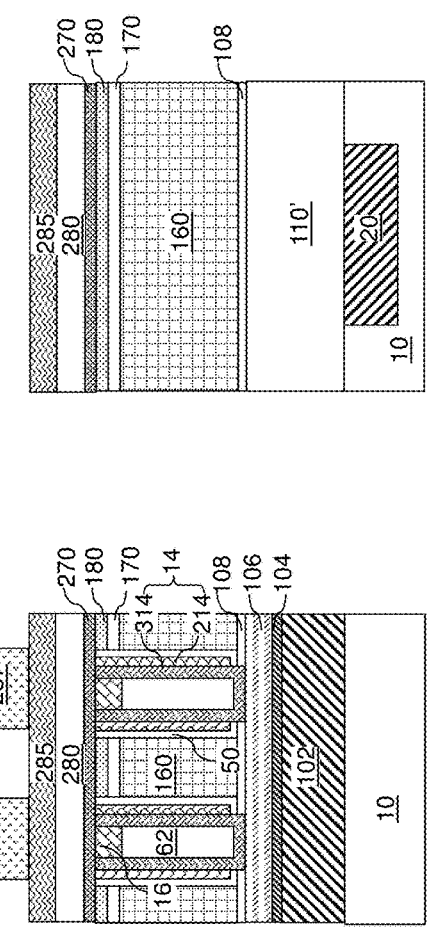
FIG. 10A
FIG. 10B
FIG. 10C

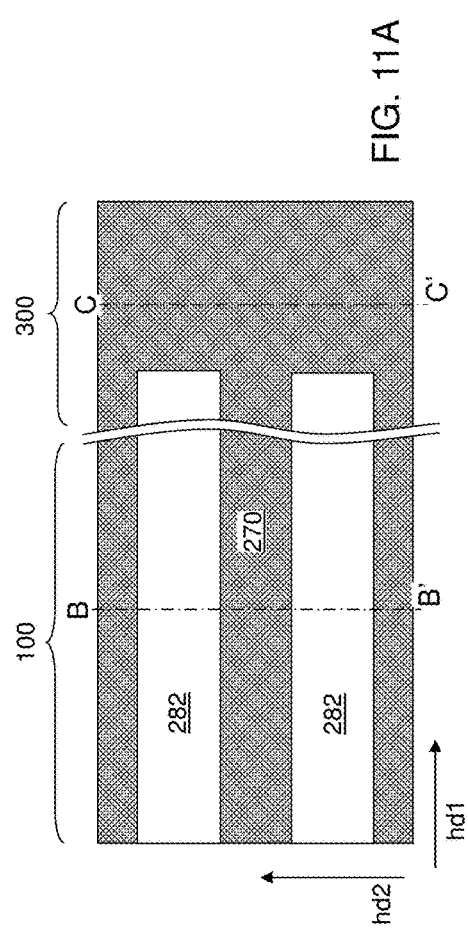
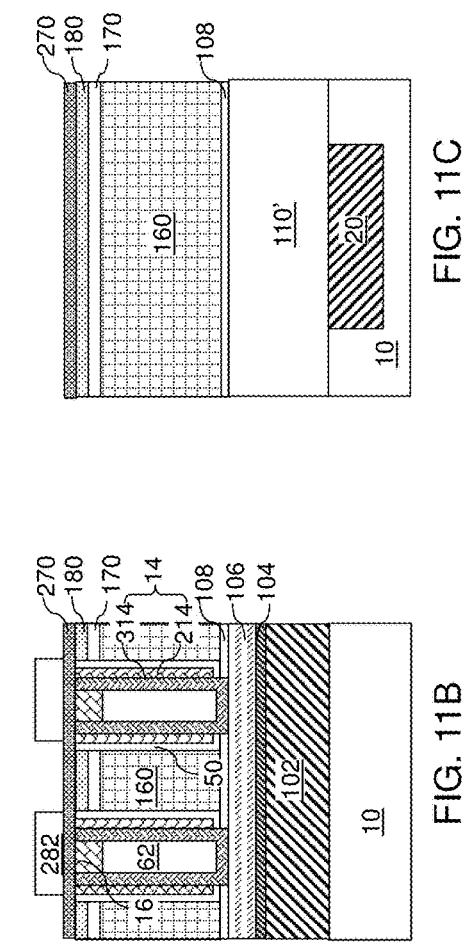

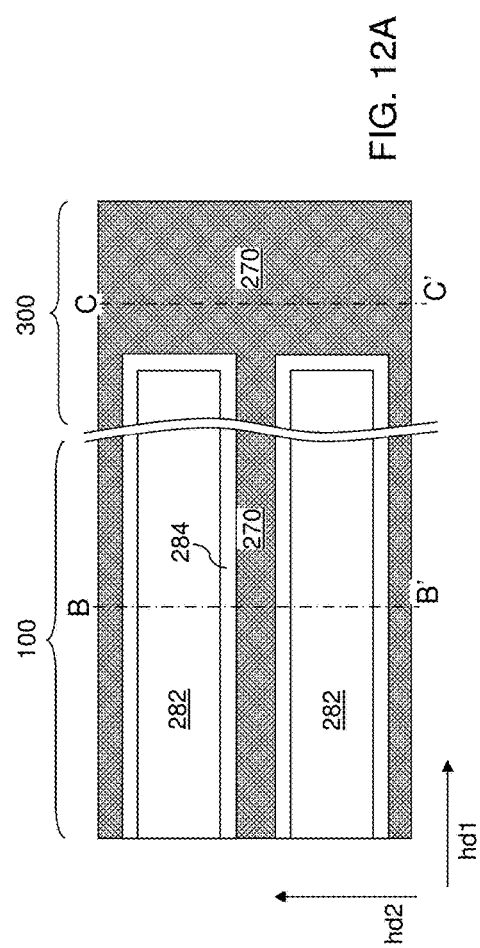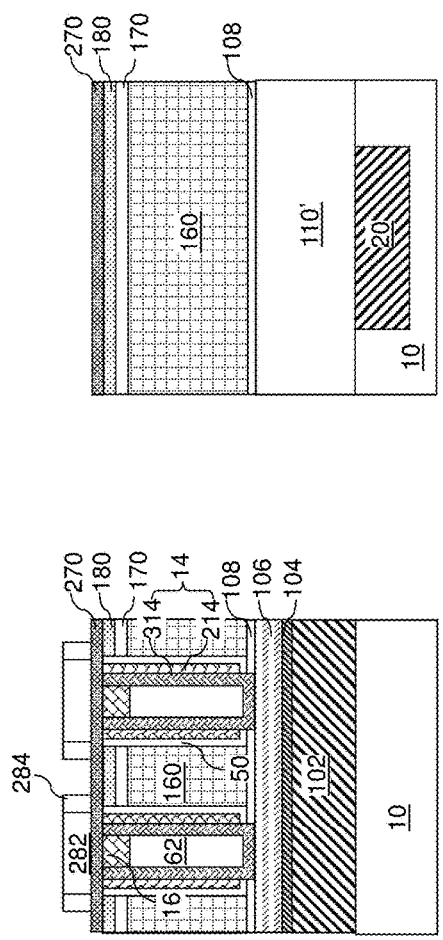

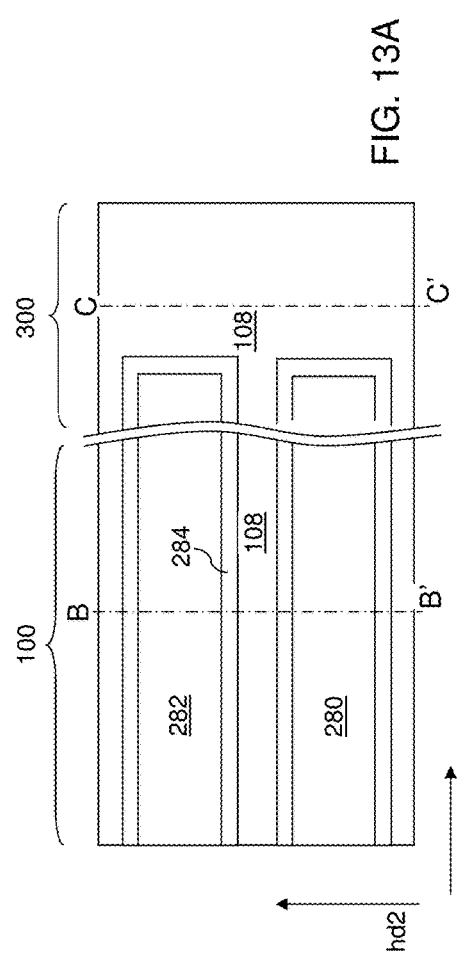
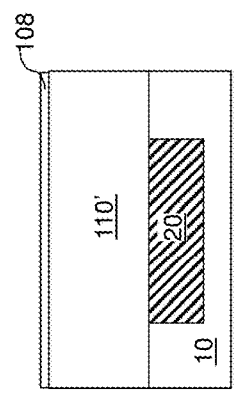
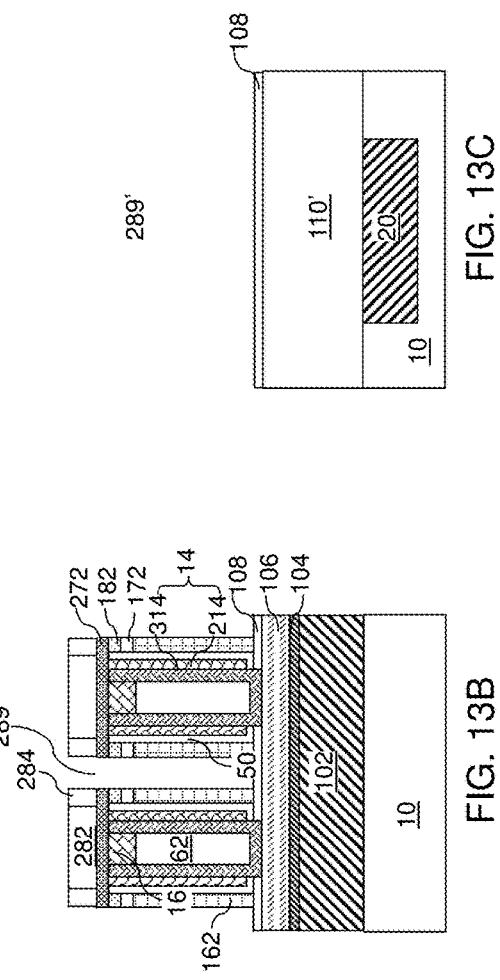

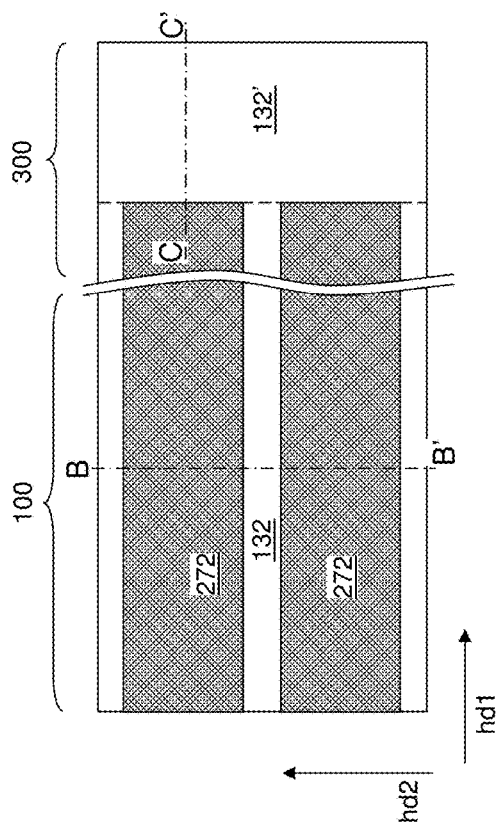
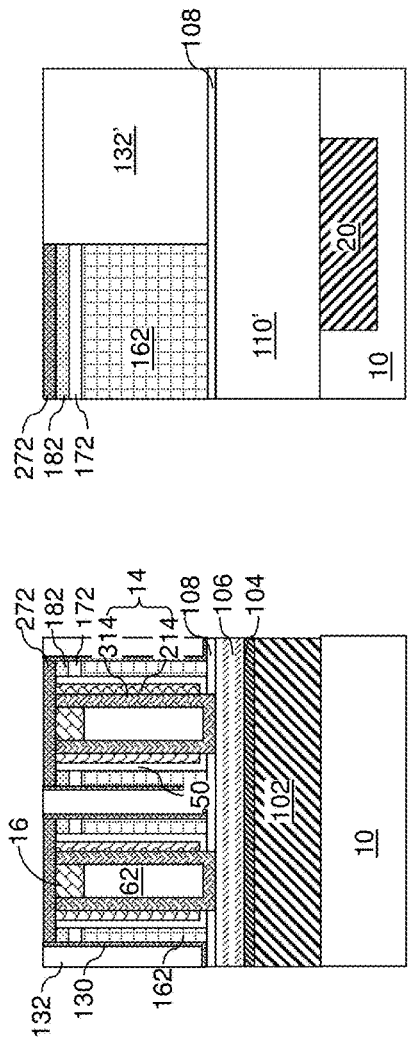
FIG. 14A
FIG. 14B
FIG. 14C

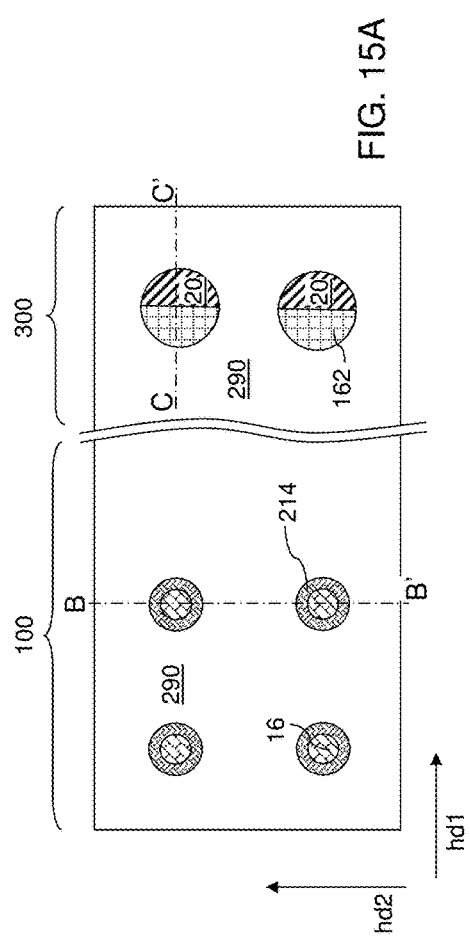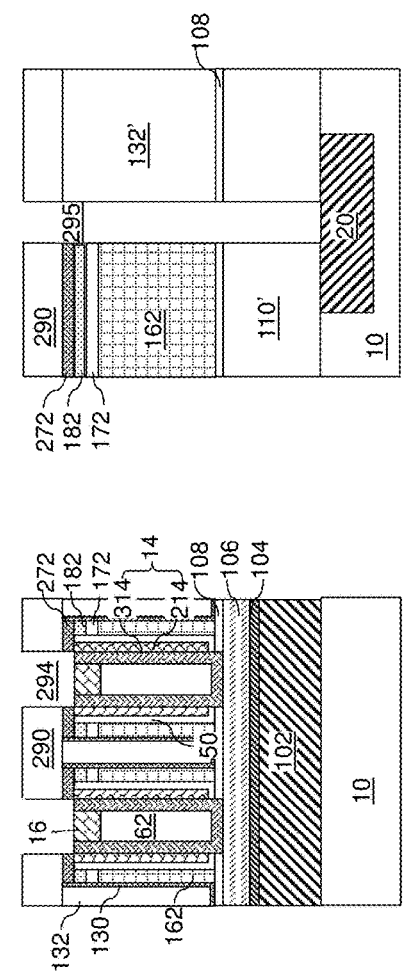

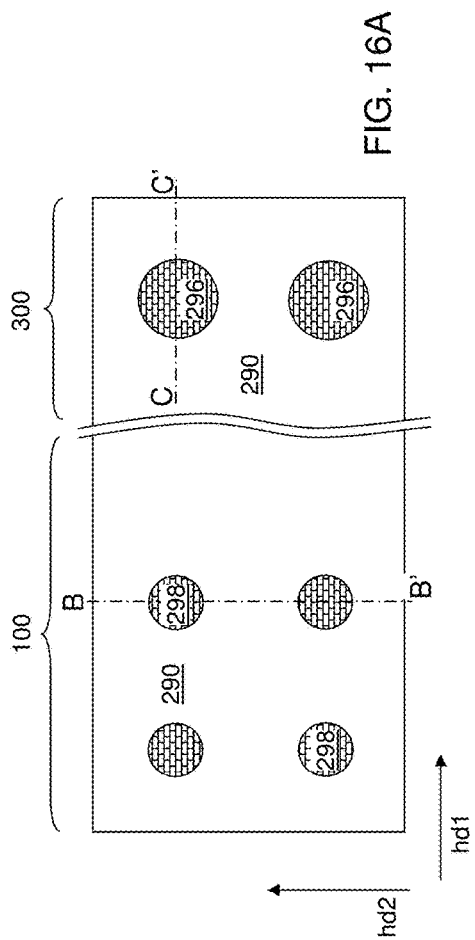
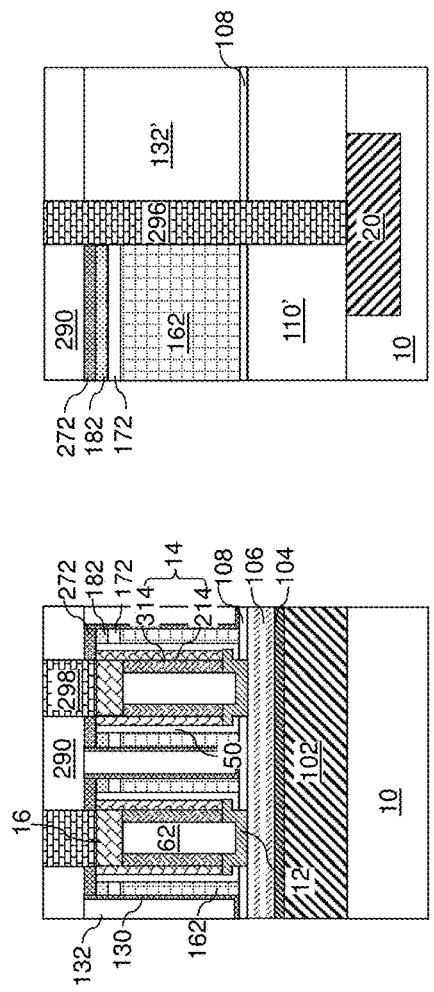
FIG. 16A
FIG. 16B
FIG. 16C

ARRAY OF HOLE-TYPE SURROUND GATE VERTICAL FIELD EFFECT TRANSISTORS AND METHOD OF MAKING THEREOF

FIELD

The present disclosure relates generally to the field of semiconductor devices and specifically to a two-dimensional array of surround gate field effect transistors and methods of manufacturing the same.

BACKGROUND

Resistive Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a semiconductor structure comprising a two-dimensional array of vertical field effect transistors is provided. The two-dimensional array of vertical field effect transistors comprises: a one-dimensional array of gate electrode lines that laterally extend along a first horizontal direction and laterally spaced among one another along a second horizontal direction, wherein each of the gate electrode lines includes a one-dimensional array of openings arranged along the first horizontal direction; a gate dielectric located inside each opening in the gate electrode lines; and a vertical semiconductor channel extending along a vertical direction and located inside each opening in the gate electrode lines and laterally surrounded by the gate dielectric.

According to another aspect of the present disclosure, a method of forming a semiconductor structure is provided, which comprises the steps of: forming doped semiconductor strips laterally spaced apart along a first horizontal direction and laterally extending along a second horizontal direction over a substrate; forming a planar insulating spacer layer, a gate conductor material layer, and a dielectric cap layer over the doped semiconductor strips; forming a two-dimensional array of openings through the dielectric cap layer and the gate electrode material layer; forming gate dielectrics in the two-dimensional array of openings; forming vertical semiconductor channels on each of the gate dielectrics by deposition of a semiconductor material; and forming gate divider rail structures through the gate conductor material layer, wherein the gate divider rail structures laterally extend along the first horizontal direction and divide the gate conductor material layer into a one-dimensional array of gate electrode lines.

BRIEF DESCRIPTION OF THE DRAWINGS

FIG. 6A is a top-down view of the exemplary structure after formation of openings through the planar insulating spacer layer according to an embodiment of the present disclosure.

FIGS. 6B-6D are vertical cross-sectional view of the exemplary structure along the vertical planes B-B', C-C', and D-D' of FIG. 6A.

FIG. 10A is a top-down view of the exemplary structure after formation of at least one hard mask layer, an optional patterning film, and a photoresist layer and patterning of the photoresist layer into a pattern of gate electrode lines to be subsequently formed according to an embodiment of the present disclosure.

FIGS. 10B and 10C are vertical cross-sectional view of the exemplary structure along the vertical planes B-B' and C-C' of FIG. 10A.

FIG. 11A is a top-down view of the exemplary structure after transfer of the pattern in the photoresist layer into a hard mask layer according to an embodiment of the present disclosure.

FIGS. 11B and 11C are vertical cross-sectional view of the exemplary structure along the vertical planes B-B' and C-C' of FIG. 11A.

FIG. 12A is a top-down view of the exemplary structure after formation of etch mask spacers according to an embodiment of the present disclosure.

FIGS. 12B and 12C are vertical cross-sectional view of the exemplary structure along the vertical planes B-B' and C-C' of FIG. 12A.

FIG. 13A is a top-down view of the exemplary structure after patterning the gate conductor material layer into gate electrode lines according to an embodiment of the present disclosure.

FIGS. 13B and 13C are vertical cross-sectional view of the exemplary structure along the vertical planes B-B' and C-C' of FIG. 13A.

FIG. 14A is a top-down view of the exemplary structure after formation of gate divider rail structures according to an embodiment of the present disclosure.

FIGS. 14B and 14C are vertical cross-sectional view of the exemplary structure along the vertical planes B-B' and C-C' of FIG. 14A.

FIG. 15A is a top-down view of the exemplary structure after formation of contact via cavities according to an embodiment of the present disclosure.

FIGS. 15B and 15C are vertical cross-sectional view of the exemplary structure along the vertical planes B-B' and C-C' of FIG. 15A.

FIG. 16A is a top-down view of the exemplary structure after formation of contact via structures and bottom active regions according to an embodiment of the present disclosure.

FIGS. 16B and 16C are vertical cross-sectional view of the exemplary structure along the vertical planes B-B' and C-C' of FIG. 16A.

DETAILED DESCRIPTION

Figure 1C:
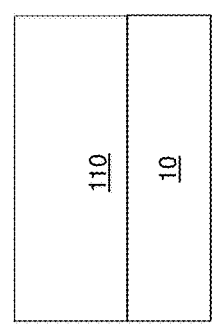
FIGS. 1B-1D are vertical cross-sectional view of the first exemplary structure along the vertical planes B-B', C-C', and D-D' of FIG. 1A.
Figure 1D:
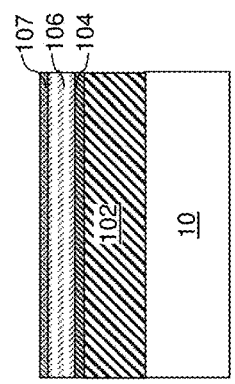
Figure 1A:
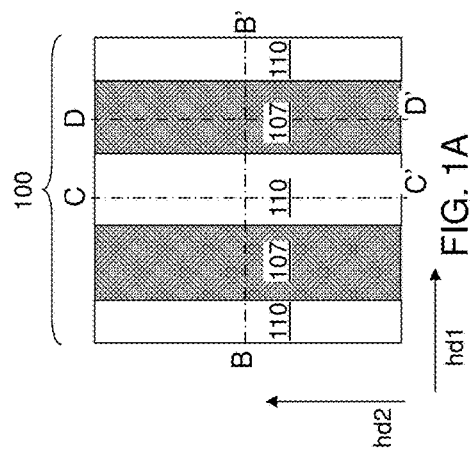
FIG. 1A is a top-down view of an exemplary structure after formation of a laterally alternating sequence of dielectric separator rails and stacks of a conductive rail, a doped semiconductor strip, and a sacrificial pad strip according to an embodiment of the present disclosure.
Figure 1B:
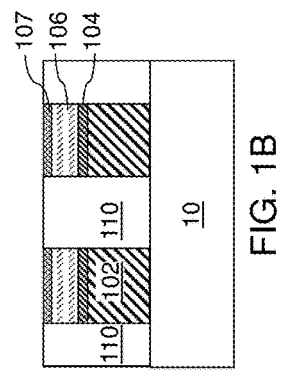
Figure 2C:
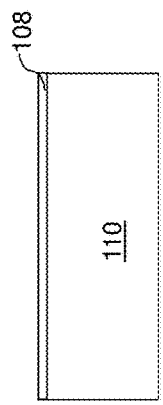
FIGS. 2B-2D are vertical cross-sectional view of the exemplary structure along the vertical planes B-B', C-C', and D-D' of FIG. 2A.
Figure 2D:
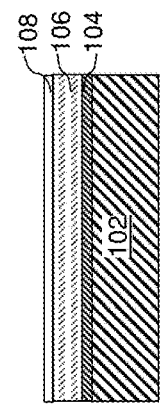
Figure 2A:
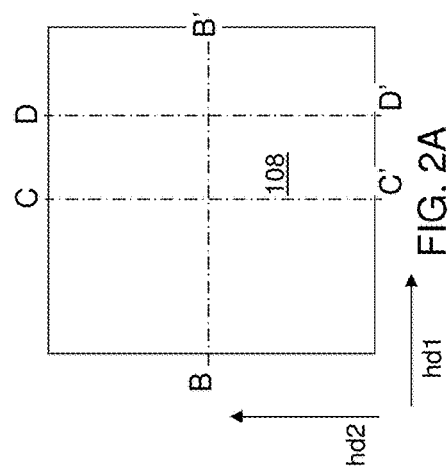
FIG. 2A is a top-down view of the exemplary structure after removal of the sacrificial pad strips, recessing of the dielectric separator rails, and formation of a planar insulating spacer layer according to an embodiment of the present disclosure.
Figure 2B:
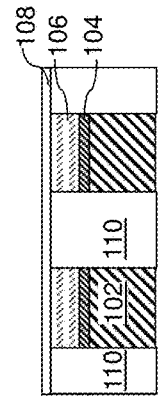
Figure 3C:
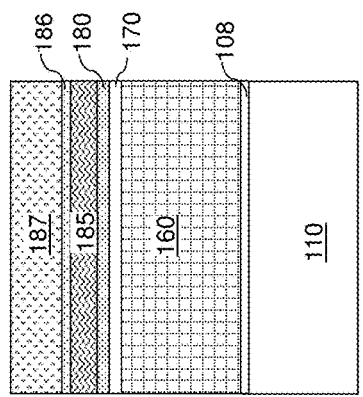
FIGS. 3B-3D are vertical cross-sectional view of the exemplary structure along the vertical planes B-B', C-C', and D-D' of FIG. 3A.
Figure 3D:
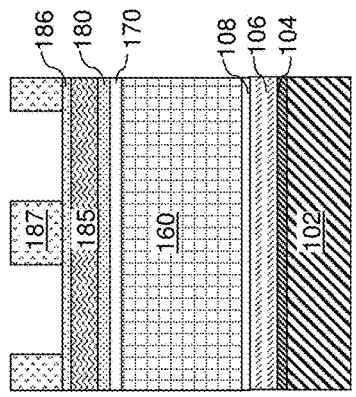
Figure 3A:
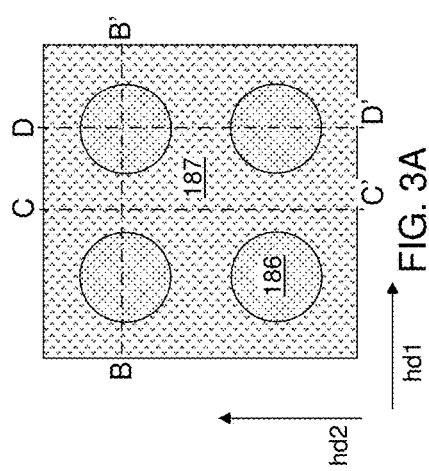
FIG. 3A is a top-down view of the exemplary structure after formation of a gate conductor material layer, at least one dielectric cap layer, an optional patterning film, an optional antireflection coating layer, and a photoresist layer and patterning of the photoresist layer to form a two-dimensional array of openings according to an embodiment of the present disclosure.
Figure 3B:
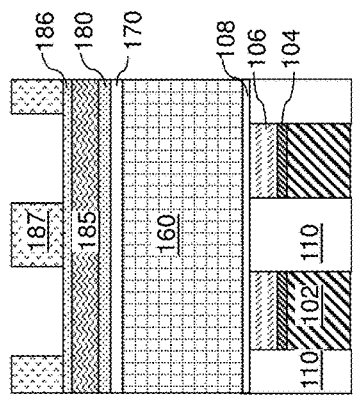
Figure 4C:
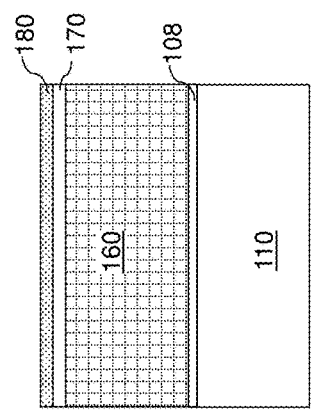
FIGS. 4B-4D are vertical cross-sectional view of the exemplary structure along the vertical planes B-B', C-C', and D-D' of FIG. 4A.
Figure 4D:
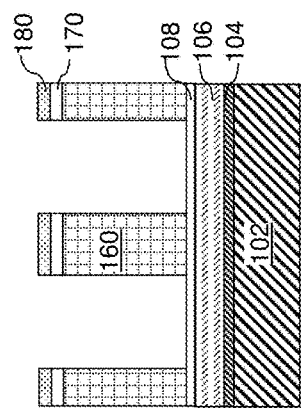
Figure 4A:
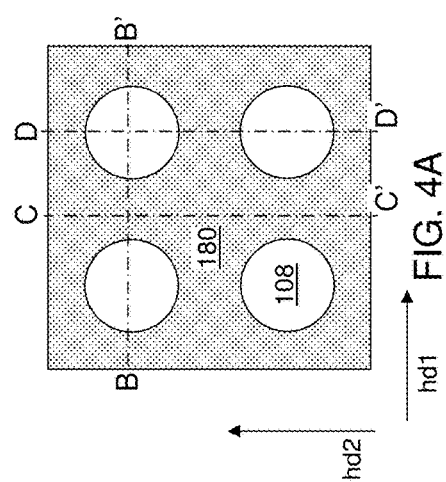
FIG. 4A is a top-down view of the exemplary structure after formation of a two-dimensional array of openings through the at least one dielectric cap layer and the gate conductor material layer according to an embodiment of the present disclosure.
Figure 4B:
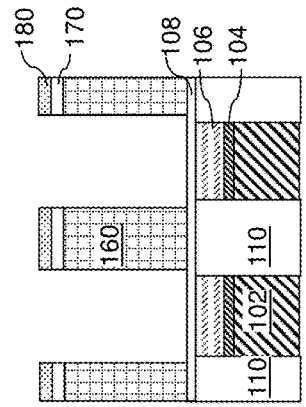
Figure 5A:
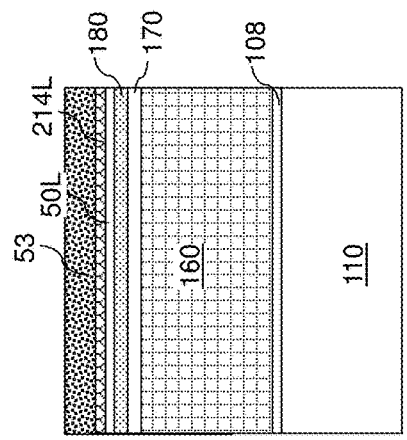
FIG. 5A is a top-down view of the exemplary structure after formation of a gate dielectric layer, a first semiconductor channel layer, and a patterning film according to an embodiment of the present disclosure.
Figure 5B:
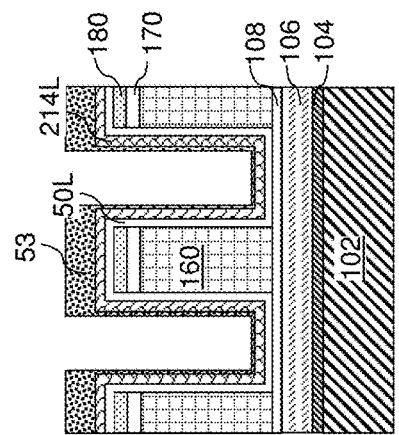
FIGS. 5B-5D are vertical cross-sectional view of the exemplary structure along the vertical planes B-B', C-C', and D-D' of FIG. 5A.
Figure 5C:
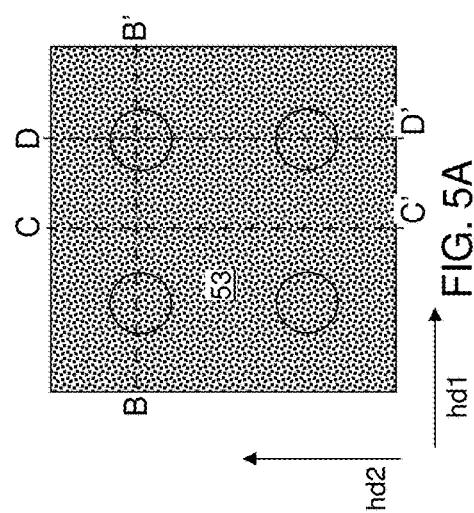
Figure 5D:
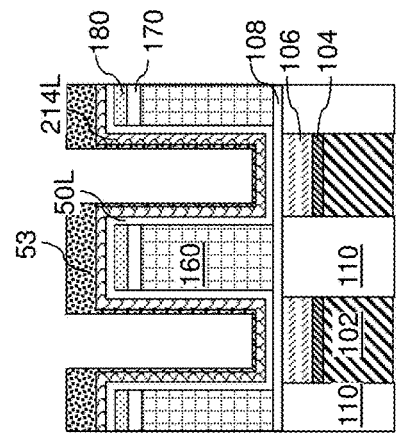
Figure 7A:
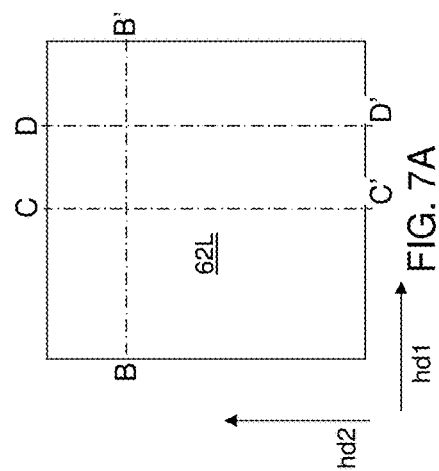
FIG. 7A is a top-down view of the exemplary structure after deposition of a second semiconductor channel layer and a dielectric material layer according to an embodiment of the present disclosure.
Figure 7C:
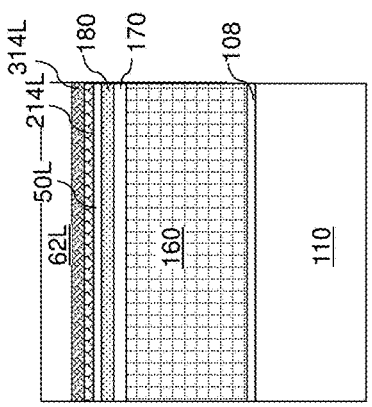
FIGS. 7B-7D are vertical cross-sectional view of the exemplary structure along the vertical planes B-B', C-C', and D-D' of FIG. 7A.
Figure 7B:
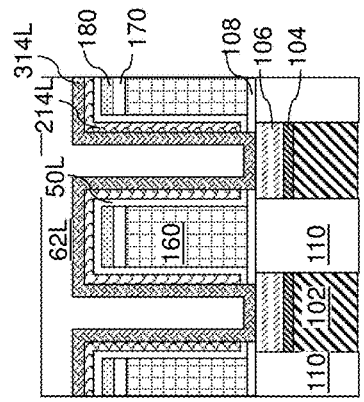
Figure 7D:
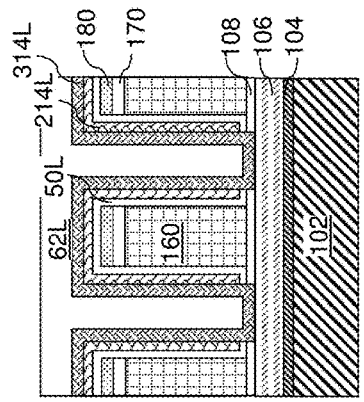
Figure 8A:
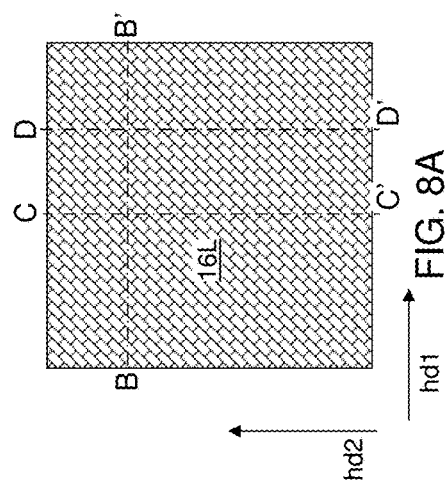
FIG. 8A is a top-down view of the exemplary structure after deposition of a doped semiconductor material layer according to an embodiment of the present disclosure.
Figure 8C:
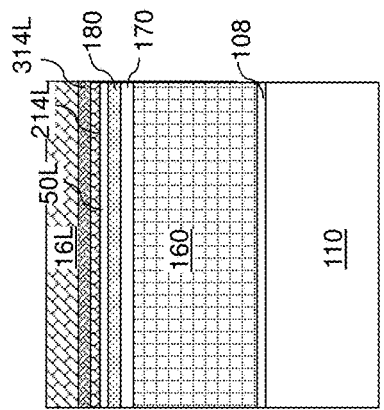
FIGS. 8B-8D are vertical cross-sectional view of the exemplary structure along the vertical planes B-B', C-C', and D-D' of FIG. 8A.
Figure 8B:
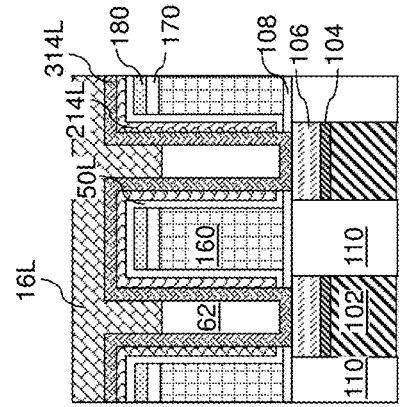
Figure 8D:
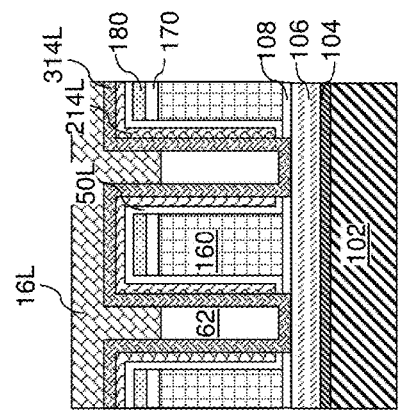
Figure 9A:
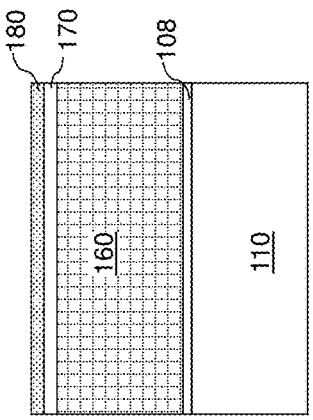
FIG. 9A is a top-down view of the exemplary structure after formation of vertical semiconductor channels and top active regions according to an embodiment of the present disclosure.
Figure 9B:
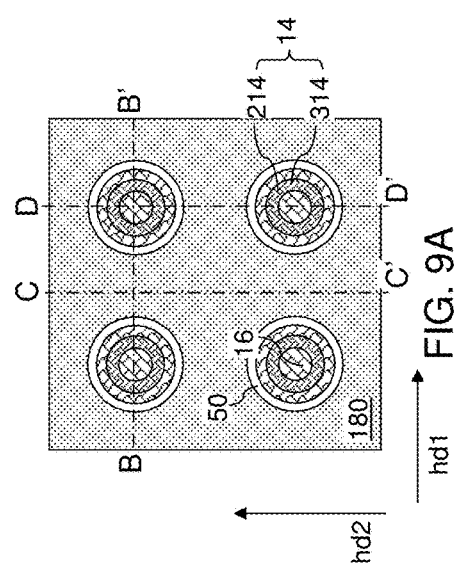
FIGS. 9B-9D are vertical cross-sectional view of the exemplary structure along the vertical planes B-B', C-C', and D-D' of FIG. 9A.
Figure 9C:
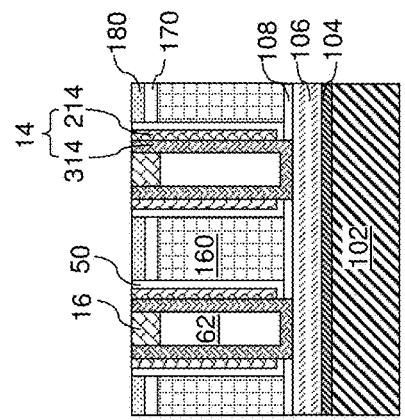
Figure 9D:
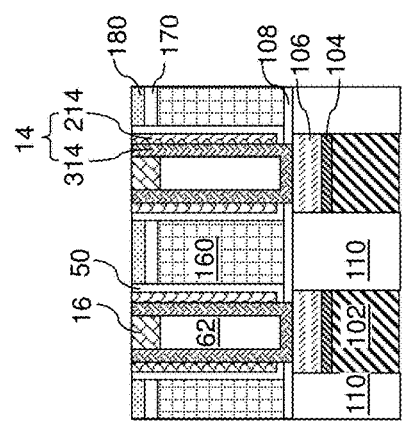

Resistive memory cells of a ReRAM memory device can be arranged in a three-dimensional array that is accessed by a two-dimensional array of vertical bit lines. A two-dimensional array of vertical select field effect transistors can be connected to the two-dimensional array of vertical bit lines to access the resistive memory cells. The present inventors realized that conventional vertical select field effect transistors may contain suboptimum on current and leakage current. Such vertical field effect transistors typically have a dual channel configuration, in which each vertical channel is controlled by a pair of gate electrodes. Typically, each vertical channel has a rectangular horizontal cross-sectional shape, and the pair of gate electrodes controls electron flow along two sidewalls of a rectangular pillar that constitutes the vertical channel Current flow along the other two sidewalls of the rectangular pillar is only indirectly controlled by the pair of gate electrodes in this configuration. Thus, leakage current and degradation of turn-on characteristics are common in such configurations. In one embodiment of the present disclosure, the vertical select field effect transistor contains a ladder shaped surround select gate electrode which surrounds the entire channel. This configuration can improve the on current of the transistor As discussed above, the present disclosure is directed to a two-dimensional array of surround gate field effect transistors and methods of manufacturing the same, the various aspects of which are described below. The embodiments of the disclosure can be employed to form various semiconductor devices, such as three-dimensional monolithic memory array devices comprising ReRAM devices, that include a two-dimensional array of vertical field effect select transistors. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

Referring to FIGS. 1A-1D, an array region 100 of an exemplary structure is illustrated. The exemplary structure includes a substrate 10 and an alternating sequence of conductive rails 102 and dielectric separator rails 110 that alternate along a first horizontal direction hd1 in the array region 100. The substrate 10 may include a semiconductor material layer and semiconductor devices formed thereupon, and may include metal interconnect structures embedded within dielectric material layers.

A layer stack including a conductive material layer, an optional metal nitride layer, a doped semiconductor layer, and a sacrificial pad layer can be deposited on the top surface of the substrate 10. In an illustrative example, the conductive material layer can include tungsten or copper; the optional metal nitride layer can include titanium nitride, tantalum nitride layer, or tungsten nitride layer; the doped semiconductor layer can include doped polysilicon or doped amorphous silicon (that can be subsequently converted into doped polysilicon through an anneal) having a doping of a first conductivity type (which can be p-type or n-type); and the sacrificial pad layer can include silicon nitride or silicon oxynitride. The thickness of the conductive material layer can be in a range from 50 nm to 300 nm, the thickness of the optional metal nitride layer can be in a range from 3 nm to 30 nm, the thickness of the doped semiconductor layer can be in a range from 10 nm to 40 nm, and the thickness of the sacrificial pad layer can be in a range from 4 nm to 40 nm, although lesser and greater thicknesses can be employed for each layer.

Line trenches are formed through the layer stack, for example, by applying and patterning a photoresist layer (not shown) over the layer stack and transferring the pattern in the photoresist layer through the by at least one anisotropic etch process. The line trenches are laterally spaced among one another along the first horizontal direction hd1, and laterally extend along a second horizontal direction hd2 (i.e., global bit line direction) that is perpendicular to the first horizontal direction hd1. As used herein, a "line trench" refers to an elongated trench having a uniform width along a direction perpendicular to the lengthwise direction thereof. A top surface of an underlying substrate 10 can be physically exposed at the bottom of each line trench. At least one dielectric material (such as a combination of a silicon nitride liner and a silicon oxide fill material) can be deposited in the line trenches, and excess portions of the at least one dielectric material can be removed from the horizontal plane including the top surface of the sacrificial pad layer by a planarization process (such as a chemical mechanical planarization process or a recess etch process).

Remaining portions of the at least one dielectric material constitute dielectric separator rails 110. As used herein, a "rail" refers to a structure that laterally extends in a lengthwise direction. In one non-limiting embodiment, a rail can extend with a uniform vertical cross-sectional shape along the vertical planes that are perpendicular to the lengthwise direction of the structure. Each remaining portion of the conductive material layer constitutes a conductive rail 102 that laterally extends along the second horizontal direction hd2. An alternating sequence of conductive rails 102 and dielectric separator rails 110 that alternate along the second horizontal direction hd2 is formed. Each remaining portion of the metal nitride layer constitutes a metal nitride strip 104 that laterally extends along the second horizontal direction hd2 and has a uniform width along the first horizontal direction hd1. Each combination of a conductive rail 102 and optional overlying metal nitride strip 104 can correspond to a global bit line of a ReRAM device. The alternating sequence of conductive rails 102 and dielectric separator rails 110 can have a pitch in a range from 50 nm to 400 nm along the first horizontal direction hd1, although lesser and greater pitches can also be employed. The width of the conductive rails 102 can be in a range from 20% to 80% of the pitch. The width of the dielectric separator rails 110 can be in a range from 20% to 80% of the pitch.

Each remaining portion of the doped semiconductor layer constitutes a doped semiconductor strip 106, which is a doped semiconductor layer having a finite width. Specifically, each doped semiconductor strip 106 laterally extends along the second horizontal direction hd2 and has the uniform width along the first horizontal direction hd1. The doped semiconductor strips 106 can have a first width along the first horizontal direction hd1 and can laterally extend along the second horizontal direction hd2. Each doped semiconductor strip 106 may comprise a global source or drain region of a ReRAM device. Each remaining portion of the sacrificial pad layer constitutes a sacrificial pad strip 107 that laterally extends along the second horizontal direction hd2 and has the uniform width along the first horizontal direction hd1. In an alternative embodiment, the sacrificial pad strip 107 is removed first by selective etching followed by chemical mechanical planarization of the dielectric separator rails 110 to the top of the doped semiconductor strips 106 which are used a polish stop.

Referring to FIGS. 2A-2D, the dielectric separator rails 110 can be optionally vertically recessed, for example, by a recess etch approximately to the height of the top surfaces of the doped semiconductor strips 106. If the dielectric separator rails 110 include silicon oxide, a wet etch employing dilute hydrofluoric acid may be employed. Concurrently or subsequently, the sacrificial pad strips 107 can be removed by an isotropic etch process such as a wet etch process. In an illustrative example, if the sacrificial pad strips 107 include silicon nitride, a wet etch employing hot phosphoric acid can be employed to remove the sacrificial pad strips 107.

A planar insulating spacer layer 108 including an insulating material such as silicon oxide can be deposited over the doped semiconductor strips 106 and the dielectric separator rails 110. The planar insulating spacer layer 108 can have a uniform thickness, which can be in a range from 10 nm to 50 nm, such as from 15 nm to 30 nm.

Referring to FIGS. 3A-3D, a gate conductor material layer 160, at least one dielectric cap layer (170, 180), an optional patterning film 185, an optional antireflection coating (ARC) layer 186, and a photoresist layer 187 can be sequentially formed over the planar insulating spacer layer 108.

The gate conductor material layer 160 includes a conductive material that is subsequently patterned into gate electrode lines. The gate conductor material layer 160 can include a doped semiconductor material (such as doped polysilicon or an amorphous doped polysilicon that can be subsequently converted to doped polysilicon by a crystallization anneal) or a metallic material (such as a conductive metal nitride, an elemental metal, or an intermetallic alloy). For example, the gate conductor material layer 160 can include doped polysilicon or doped amorphous silicon having p-type doping or n-type doping. The thickness of the gate conductor material layer 160 can be in a range from 75 nm to 600 nm, such as from 150 nm to 300 nm, although lesser and greater thicknesses can also be employed.

The at least one dielectric cap layer (170, 180) can include a first dielectric cap layer 170 and a second dielectric cap layer 180. For example, the first dielectric cap layer 170 can include silicon oxide and have a thickness in a range from 10 nm to 100 nm, and the second dielectric cap layer 180 can include silicon nitride (e.g., hard mask material) and have a thickness in a range from 10 nm to 100 nm, although different materials and/or lesser or greater thicknesses can be employed for each of the first and second dielectric cap layers (170, 180).

The optional patterning film 185 can be, for example, a carbon film, such as an Advanced Patterning Film® (APF) available from Applied Materials, Inc. The optional antireflection coating (ARC) layer 186 includes an antireflective coating material. The photoresist layer 187 can include a deep ultraviolet (DUV) photoresist material.

The photoresist layer 187 can be lithographically patterned to form a two-dimensional array of openings therethrough. In one embodiment, the two-dimensional array of openings can be periodic two-dimensional array having a first periodicity along the first horizontal direction hd1 and having a second periodicity along the second horizontal direction hd2. In one embodiment, the two-dimensional array of openings can be a rectangular array or a hexagonal array. Each opening in the patterned photoresist layer 187 can have a substantially same horizontal cross-sectional shape, which can be the shape of a circle, an ellipse, an oval, a rectangle, a hexagon, or any other polygon or a curvilinear shape of a two-dimensional closed shape. In one embodiment, the openings in the patterned photoresist layer 187 can have a shape of a circle or an ellipse.

The openings in the photoresist layer 187 can be arranged in various patterns. In one embodiment, the pattern of the openings in the photoresist layer 187 can be a pattern of a periodic rectangular array. The areas of the openings in the photoresist layer 187 can overlap with the areas of the doped semiconductor strips 106.

Referring to FIGS. 4A-4D, an anisotropic etch process is performed to transfer the pattern of the photoresist layer 187 through the optional antireflection coating layer 186, the optional patterning film 185, the at least one dielectric cap layer (170, 180), and the gate conductor material layer 160. A two-dimensional array of openings having vertical sidewalls is formed through the optional antireflection coating layer 186, the optional patterning film 185, the at least one dielectric cap layer (170, 180) and the gate conductor material layer 160. A top surface of the planar insulating spacer layer 108 can be physically exposed at the bottom of each opening in the gate conductor material layer 160. The shape of each opening can be cylindrical with a horizontal cross-sectional shape that is the same as the horizontal cross-sectional shape of an overlying opening in the photoresist layer 187. The photoresist layer 187, the optional antireflection coating layer 186, and the optional patterning film 185 can be subsequently removed, for example, by ashing.

Referring to FIGS. 5A-5D, a gate dielectric layer SOL can be formed on the sidewalls of the gate conductor material layer 160. The gate dielectric layer SOL can be formed by conformal deposition of at least one dielectric material and/or oxidation of surface portions of the gate conductor material layer 160. The gate dielectric layer SOL can include silicon oxide and/or a dielectric metal oxide. The thickness of the gate dielectric layer SOL can be in a range from 1 nm to 10 nm, such as from 2 nm to 6 nm, although lesser and greater thicknesses can also be employed.

A first semiconductor channel layer 214L can be subsequently deposited on the gate dielectric layer SOL. The first semiconductor channel layer 214L includes an intrinsic semiconductor material or a semiconductor material having a doping of a second conductivity type, which is the opposite of the first conductivity type. For example, if the first conductivity type is n-type, the second conductivity type can be p-type, and vice versa. For example, the first semiconductor channel layer 214L can include doped amorphous silicon or doped polysilicon, and can have a thickness in a range from 3 nm to 100 nm, such as from 6 nm to 50 nm, although lesser and greater thicknesses can also be employed.

A patterning film 53 can be deposited over the first semiconductor channel layer 214L. The patterning film 53 can include amorphous carbon, diamond-like carbon (DLC), or a carbon-based compound, and can be deposited by an anisotropic deposition method such that the thickness of the patterning film 53 over the at least one dielectric cap layer (170, 180) is greater than the thickness of the patterning film 53 at the bottom of the two-dimensional array of openings, and is greater than the thickness of the patterning film 53 on the sidewalls of the first semiconductor channel layer 214L.

Referring to FIGS. 6A-6D, an anisotropic etch process is performed to etch through the bottom portions of the patterning film 53 at the bottom of each opening through the gate conductor material layer 160. The duration of the anisotropic etch is selected such that the etch depth into the material of the patterning film 53 is greater than the thickness of the patterning film 53 at the bottom of the openings in the gate conductor material layer 160, and is less than the thickness of the patterning film 53 above the at least one dielectric cap layer (170, 180). Thus, remaining portions of the patterning film 53 are present above the at least one dielectric cap layer (170, 180) at the end of the anisotropic etch process, while the patterning film 53 is etched through at the bottom of the openings in the gate conductor material layer 160.

Another anisotropic etch process is performed, which etches the material of the planar insulating spacer layer 108 selective to the material of the patterning film 53. A two-dimensional array of openings is formed through the planar insulating spacer layer 108 underneath the two-dimensional array of openings within the gate conductor material layer 160, the gate dielectric layer 50L, and the first semiconductor channel layer 214L. Portions of the top surfaces of the doped semiconductor strips 106 are physically exposed underneath the two-dimensional array of openings through the planar insulating spacer layer 108.

Referring to FIGS. 7A-7D, a second semiconductor channel layer 314L including an intrinsic or doped semiconductor material having a doping of the second conductivity type can be deposited on the physically exposed surfaces of the doped semiconductor strips 106, on sidewalls of the planar insulating spacer layer 108 and the gate dielectric layer 50L, and on the physically exposed surfaces of the first semiconductor channel layer 214L. For example, the second semiconductor channel layer 314L can include doped polysilicon or doped amorphous silicon. The second semiconductor channel layer 314L can be deposited by a conformal deposition process such as chemical vapor deposition (CVD). The doped amorphous silicon can be subsequently crystallized to polysilicon by a crystallization anneal.

Subsequently, a dielectric material is deposited in remaining volumes of the openings through the gate conductor material layer 160 to form a dielectric core material layer 62L. The dielectric core material layer 62L includes a dielectric fill material such as silicon oxide. Optionally, a reflow process may be performed to reflow the dielectric fill material, and to reduce the volume of any voids within the dielectric core material layer 62L.

Referring to FIGS. 8A-8D, the material of the dielectric core material layer 62L can be recessed by an etch process. The etch process may be an isotropic etch process or an anisotropic etch process. For example, if the dielectric core material layer 62L includes silicon oxide, a wet etch employing hydrofluoric acid can be employed to recess the dielectric core material layer 62L. In one embodiment, the etch process can be selective to the material of the second semiconductor channel layer 314L. Top surfaces of the remaining portions of the dielectric core material layer 62L cab be located below the topmost surfaces of the at least one dielectric cap layer (170, 180). Each remaining portion of the dielectric core material layer 62L constitutes a dielectric core 62, which can be a dielectric pillar structure having a substantially uniform horizontal cross-sectional shape that is invariant with height.

A doped semiconductor material layer 16L having a doping of the first conductivity type can be deposited in the recessed regions overlying the dielectric cores 62 and on the physically exposed surfaces of the second semiconductor channel layer 314L. The doped semiconductor material layer 16L can include doped polysilicon or doped amorphous silicon, and can be deposited by a conformal or a non-conformal deposition process. The doped amorphous silicon can be subsequently crystallized to polysilicon by a crystallization anneal.

Referring to FIGS. 9A-9D, a planarization process is performed to remove portions of the doped semiconductor material layer 16L, the second semiconductor channel layer 314L, the first semiconductor channel layer 214L and the gate dielectric layer 50L from above the horizontal plane including the topmost surface of the at least one dielectric cap layer (170, 180). In one embodiment, the planarization process can include a chemical mechanical planarization (CMP) process that removes the materials of the doped semiconductor material layer 16L, the second semiconductor channel layer 314L, the first semiconductor channel layer 214L, and the gate dielectric layer 50L employing the at least one dielectric cap layer (170, 180) as a stopping layer. For example, if the second dielectric cap layer 180 includes silicon nitride, the chemical mechanical planarization process can remove the semiconductor materials of the doped semiconductor material layer 16L, the second semiconductor channel layer 314L, and the first semiconductor channel layer 214L, and the dielectric material of the gate dielectric layer 50L employing the second dielectric cap layer 180 as a stopping layer. Additionally or alternatively, the planarization process can include a recess etch that etches the semiconductor materials of the doped semiconductor material layer 16L, the second semiconductor channel layer 314L, the first semiconductor channel layer 214L, and the gate dielectric layer 50L selective to the material(s) of the at least one dielectric cap layer (170, 180). A top surface of the at least one dielectric cap layer (170, 180) can be physically exposed after the planarization process.

Each remaining portion of the doped semiconductor material layer 16L constitutes a top active region 16. Each remaining portion of the second semiconductor channel layer 314L constitutes a second semiconductor channel portion 314. Each remaining portion of the first semiconductor channel layer 214L constitutes a first semiconductor channel portion 214. Each adjoining set of a first semiconductor channel portion 214 and a second semiconductor channel portion 314 constitutes a vertical semiconductor channel 14. Each remaining portion of the gate dielectric layer 50L constitutes a gate dielectric 50. In one embodiment, each gate dielectric 50 can have a cylindrical portion having an inner vertical sidewall and an outer vertical sidewall, and a horizontal "foot" portion including an opening of a lesser maximum lateral dimension than the maximum lateral dimension (such as a diameter or a major axis) of the opening of the overlying cylindrical portion.

Referring to FIGS. 10A-10C, the array region 100 and a contact region 300 of the exemplary structure is illustrated. The contact region 300 can be located adjacent to the array region 100. Metal interconnect structures 20 can be embedded within a dielectric material portion of the substrate 10 in the contact region 300. A dielectric material layer 110' including the same dielectric material as the dielectric separator rails 110 can be provided at the level of the dielectric separator rails 110 within the contact region 300. The contact region 300 can be employed to form contact via structures that contact gate electrode lines to be subsequently patterned out of the gate electrode material layer 160 and a subset of the metal interconnect structures 20.

At least one hard mask layer (270, 280) can be deposited over the at least one dielectric cap layer (170, 180). The at least one hard mask layer (270, 280) can include a first hard mask layer 270 and a second hard mask layer 280. For example, the first hard mask layer 270 can include silicon nitride and have a thickness in a range from 20 nm to 80 nm, and the second hard mask layer 280 can include silicon oxide and have a thickness in a range from 20 nm to 120 nm, although lesser and greater thicknesses can be employed for each of the first and second hard mask layers (270, 280).

An optional patterning film 285 can be formed over the at least one hard mask layer (270, 280). The optional patterning film 285 can include a suitable patterning material such as a selective molecular assembly patterning (SMAP) material.

A photoresist layer 287 can be applied over the optional patterning film 285, and can be lithographically patterned with the pattern of gate electrode lines to be subsequently formed. For example, the lithographically patterned portions of the photoresist layer 287 can include a one-dimensional array of line patterns such that each line pattern laterally extends along the first horizontal direction hd1 and is repeated along the second horizontal direction hd2. The areas of the patterned portions of the photoresist layer can overlie the areas of the vertical semiconductor channels 14 and the gate dielectrics 50.

Referring to FIGS. 11A-11C, an anisotropic etch is performed to etch through portions of the optional patterning film 285 and the second hard mask layer 280 that are not covered by the patterned photoresist layer 287. The second hard mask layer 280 can be patterned into hard mask lines 282 having the same shapes as the overlying portions of the photoresist layer 287. For example, the hard mask lines 282 can laterally extend along the first horizontal direction hd1 and can have a uniform width along the second horizontal direction hd2 that is invariant with translation along the first horizontal direction within the array region 100. The end portions of the hard mask lines 282 can extend into the contact region 300. Remaining portions of the photoresist layer 287 and the optional patterning film 285 can be subsequently removed, for example, by ashing.

Referring to FIGS. 12A-12C, etch mask spacers 284 can be formed at the periphery of each of the hard mask lines 282 by conformal deposition and anisotropic etch of an etch mask material layer. The etch mask material layer can include a material that is different from the materials of the first hard mask layer 270 and the gate electrode material layer 160. The etch mask material layer may include the same material as the hard mask lines 282. The width of the etch mask spacers 284 can be less than one half of the spacing between a neighboring pair of hard mask lines 282 so that a gap is present between each neighboring pair of etch mask spacers 284.

Referring to FIGS. 13A-13C, an anisotropic etch process is performed to transfer of the pattern of the combination of the hard mask lines 282 and the etch mask spacers 284 through the first hard mask layer 270, the at least one dielectric cap layers (170, 180), and the gate electrode material layer 160. The etch chemistry of the anisotropic etch process can be appropriately selected to sequentially etch through the first hard mask layer 270, the at least one dielectric cap layers (170, 180), and the gate electrode material layer 160, and to stop on the planar insulating spacer layer 108. Each patterned portion of the first hard mask layer 270 is herein referred to as first hard mask strips 272. Each patterned portion of the second dielectric cap layer 180 is herein referred to as a second dielectric cap strip 182. Each patterned portion of the first dielectric cap layer 170 is herein referred to as a first dielectric cap strip 172. Each patterned portion of the gate electrode material layer 160 constitutes a gate electrode line 162. Gate divider trenches 289 are formed through the first hard mask layer 270, the at least one dielectric cap layers (170, 180), and the gate electrode material layer 160, as shown in FIG. 13B. The gate divider trenches 289 are formed between neighboring rows of openings in the gate electrode material layer 160 that are arranged along the first horizontal direction hd1.

Each first hard mask strip 272 can include a pair of parallel sidewalls that laterally extend along the first horizontal direction. Each of the second dielectric cap strips 182, the first dielectric cap strips 172, and the gate electrode lines 162 includes a pair of parallel sidewalls that laterally extend along the first horizontal direction hd1, and are vertically coincident with a pair of sidewalls of a respective overlying first hard mask strip 272. As used herein, a first surface is vertically coincident with a second surface if the first surface overlies or underlies the second surface and if there exists a vertical plane including the first and second surfaces. Each of the second dielectric cap strips 182, the first dielectric cap strips 172, and the gate electrode lines 162 includes a one-dimensional array of openings that are arranged along the first horizontal direction. In one embodiment, each opening through a gate electrode line 162 is laterally spaced from the sidewalls of the gate electrode line 162. A recessed region 289' is formed over the planar insulating spacer layer 108 in the contact region 300, as shown in FIG. 13C.

Referring to FIGS. 14A-14C, a dielectric material can be deposited in the gate divider trenches 289 and the recessed region 289'. The dielectric material can include a silicon nitride liner 130 and planarizable dielectric material such as silicon oxide or a spin-on glass (SOG), and can be deposited by a conformal deposition method (such as chemical vapor deposition) or a self-planarizing deposition method (such as spin-coating). Excess portions of the deposited dielectric material can be removed from above the horizontal plane including the top surfaces of the first hard mask strips 272, which are remaining portions of the first hard mask layer 270. Remaining portions of the dielectric material in the gate divider trenches 289 constitute gate divider rail structures 232, which are dielectric rail structures having top surfaces within the same horizontal plane as the top surfaces of the first hard mask strips 272. A remaining portion of the dielectric material in the recessed region 289' in the contact region constitutes a dielectric fill material portion 132', which can have a top surface within the same horizontal plane as the top surfaces of the first hard mask strips 272. Thus, the gate divider rail structures 132 are formed through the gate conductor material layer 160. The gate divider rail structures 132 laterally extend along the first horizontal direction hd1 and divide the gate conductor material layer 160 into a one-dimensional array of gate electrode lines 162. In one embodiment, each of the gate divider rail structures 132 has a vertical cross-sectional shape of a rectangle or a trapezoid within vertical planes that are perpendicular to the first horizontal direction hd1.

Referring to FIGS. 15A-15C, a contact level dielectric layer 290 can be formed over the first hard mask strips 272, the gate divider rail structures 132, and the dielectric fill material portions 132' by deposition of a dielectric material such as silicon oxide, organosilicate glass, and/or a doped silicate glass. The thickness of the contact level dielectric layer 290 can be in a range from 50 nm to 600 nm, such as from 100 nm to 300 nm, although lesser and greater thicknesses can also be employed.

One or more photoresist layers (not shown) can be applied over the contact level dielectric layer 290, and can be lithographically patterned to form opening in areas in which contact via structures are to be subsequently formed. Contact via cavities (294, 295) can be formed through the contact level dielectric layer 290 and underlying dielectric material portions. The contact via cavities (294, 295) include transistor contact via cavities 294 that are formed above the top active regions 16 in the array region 100 and gate contact via cavities 295 that are formed in the contact region 300.

For example, a first patterned photoresist layer (not shown) can include openings in the array region 100 and the contact level dielectric layer 290 and first hard mask strips 272 can be etched employing the first patterned photoresist layer as an etch mask to form the transistor contact via cavities 294. A second patterned photoresist layer (not shown) can include openings in the contact region 300 and the contact level dielectric layer 290 and underlying layers can be etched employing the second patterned photoresist layer as an etch mask to form the gate contact via cavities 295. Alternatively, the order of formation of the via cavities (294, 295) can be reversed.

The chemistry of the anisotropic etch process used to form the gate contact via cavities 295 can be selected such that the anisotropic etch process etches the materials of the contact level dielectric layer 290, the first hard mask strips 182, the dielectric fill material portions 132', the planar insulating spacer layer 108, and the dielectric material layer 110' selective to the materials of the top active regions 16, the gate electrode lines 162, and the metal interconnect structures 20 in the substrate 10. In one embodiment, the contact level dielectric layer 290, the dielectric fill material portions 132', the planar insulating spacer layer 108, and the dielectric material layer 110' can include silicon-oxide based materials, the first hard mask strips 182 can include silicon nitride, the top active regions 16 and the gate electrode lines 162 can include doped polysilicon, and the metal interconnect structures 20 can include at least one metal such as tungsten or copper. In this case, terminal portions of the anisotropic etch process after etching through the first hard mask strips 272 can be etch through silicon oxide materials with selectivity to the semiconductor materials of the top active regions 16 and the gate electrode lines 162 and to the metallic material of the metal interconnect structures 20.

In one embodiment, the sidewalls of a gate electrode line 162 and a top surface of a metal interconnect structure 20 can be physically exposed within a gate contact via cavity 295. A periphery of the lower portion of the gate contact via cavity 295 can be coincident with a vertical sidewall of a gate electrode line 162. In other words, the vertical sidewall of the gate electrode line 162 can be exposed in the gate contact via cavity 295.

Figure 16D:
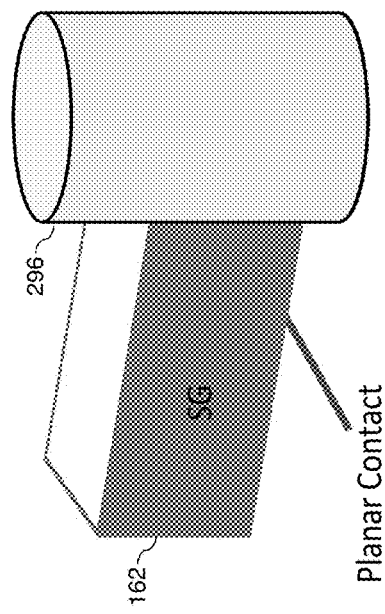
FIGS. 16D and 16E are cut-away perspective views of portions the exemplary structure of FIG. 16A.

Referring to FIGS. 16A-16E, at least one conductive material (such as at least one metallic material, such as TiN and/or tungsten) is deposited in the contact via cavities (294, 295). Excess portions of the at least one conductive material can be removed from above the top surface of the contact level dielectric layer 290 by a planarization process such as chemical mechanical planarization. Remaining portion of the at least one conductive material in the transistor contact via cavities 294 constitute top active region contact via structures 298 (i.e., top electrodes). In one embodiment, each top active region contact via structures 298 can contact a top surface of a respective one of the top active regions 16. Remaining portions of the at least one conductive material in the gate contact via cavities 295 constitute gate contact via structures 296 (e.g., zias). Each gate contact via structure 296 contacts a sidewall of a gate electrode line 162 and an underlying metal interconnect structure 20, such that the gate contact via structure 296 provides an electrically conductive path between the gate electrode line 162 and the underlying metal interconnect structure 20. In one embodiment, the underlying metal interconnect structure 20 can be electrically connected to a respective driver circuitry that drives the gate electrode line 162. As shown in FIG. 16D, a direct planar physical contact is formed between the sidewall of the gate electrode line (e.g., select gate (SG) line) 162 and a respective gate contact via structure 296 (e.g., zia). Such planar contact may reduce the contact resistance.

Figure 16E:
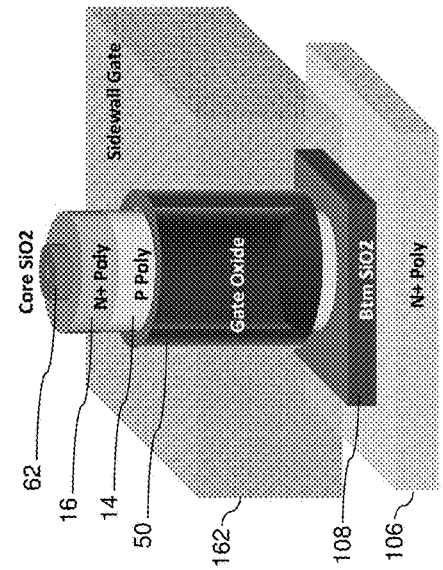

An anneal process can be performed to diffuse dopants of the first conductivity type from the doped semiconductor strips 106 into lower portions of the vertical semiconductor channels 14. In this case, the lower portions of the vertical semiconductor channels 14 can be converted into doped semiconductor regions having a doping of the first conductivity type, which are bottom active regions 12 of the vertical field effect transistors. Depending on the operational mode of the vertical field effect transistors, the top active regions 16 can be source regions and the bottom active regions 12 can be drain regions, or vice versa. FIG. 16E illustrates a perspective three-dimensional cut-away view of the resulting transistor.

Figure 17:
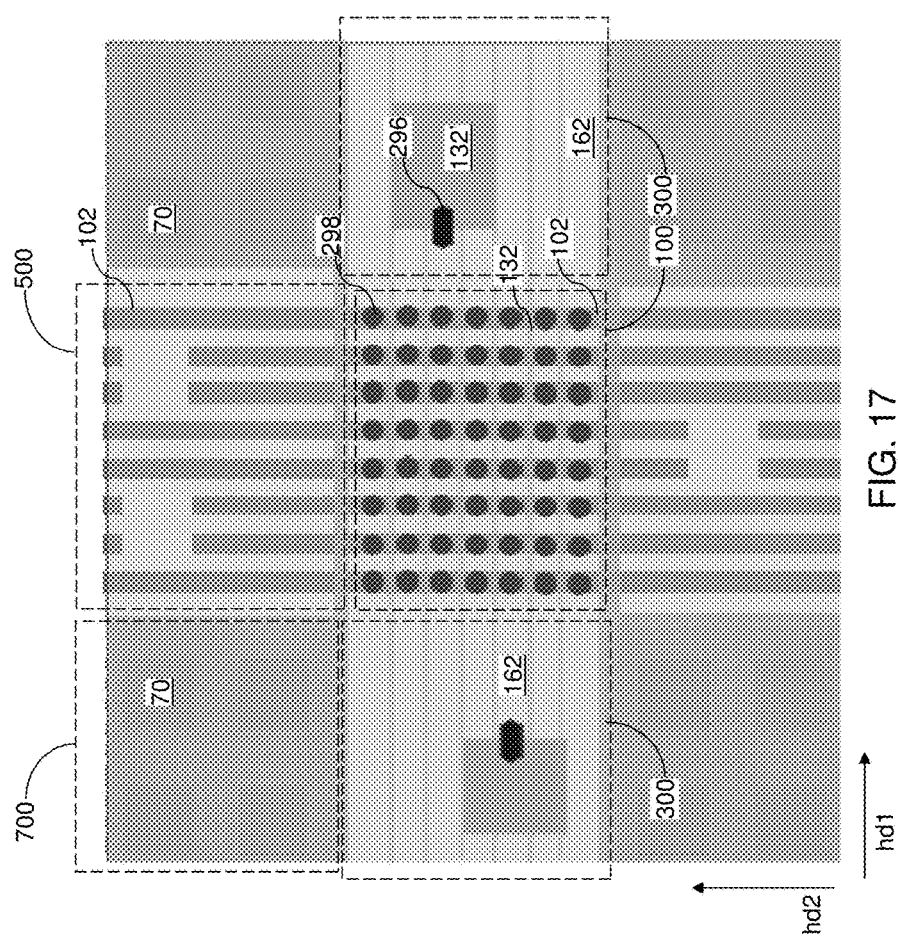
FIG. 17 is a top-down view of another embodiment of the exemplary structure at the processing steps of FIGS. 16A-16C.

The exemplary structure can include additional regions in addition to the array region 100 and the contact region 300. FIG. 17 illustrates an exemplary layout of additional regions, which can include bit line contact regions 500 that can be employed to provide electrical contact to the conductive rails 102 that may be employed as global bit lines for the vertical field effect transistors. In addition, dummy support regions 700 can be provided, which can include dummy support structures 70 that can be employed to reduce dishing during various chemical mechanical planarization processes.

Figure 18:
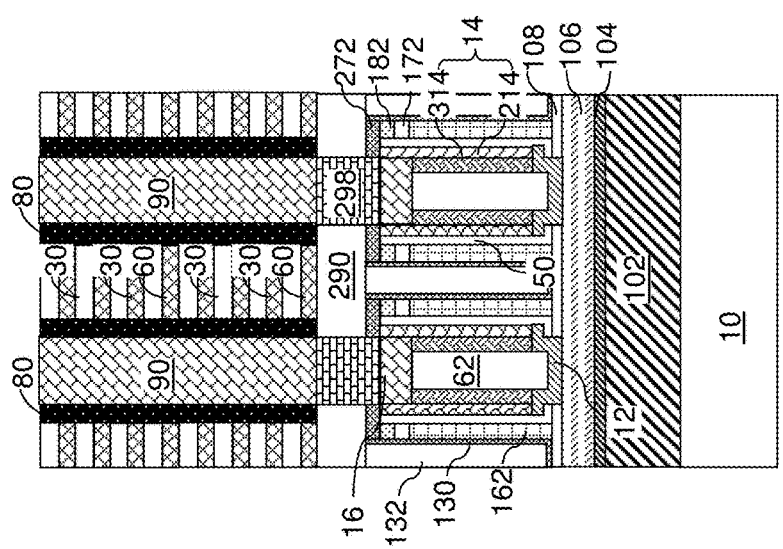
FIG. 18 is a vertical cross-sectional view of the exemplary structure after formation of a plurality of alternating stacks of insulating strips and electrically conductive strips over the two-dimensional array of vertical field effect transistors, resistive memory elements, and vertical bit lines according to an embodiment of the present disclosure.
Figure 19A:
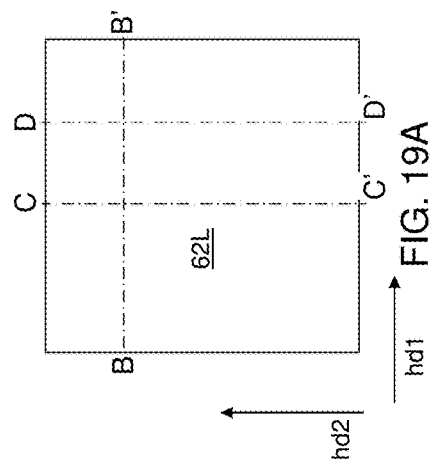
FIG. 19A is a top-down view of an alternative configuration of the exemplary structure after deposition of bottom active region, a semiconductor channel layer, and a dielectric material layer according to an embodiment of the present disclosure.
Figure 19C:
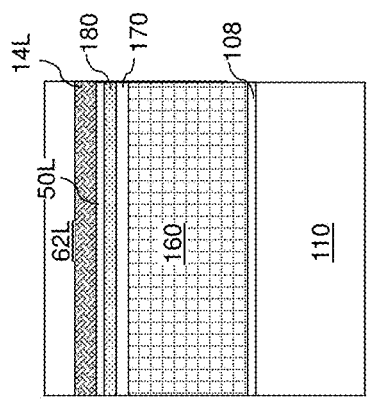
FIGS. 19B-19D are vertical cross-sectional view of the alternative configuration of the exemplary structure along the vertical planes B-B', C-C', and D-D' of FIG. 19A.
Figure 19B:
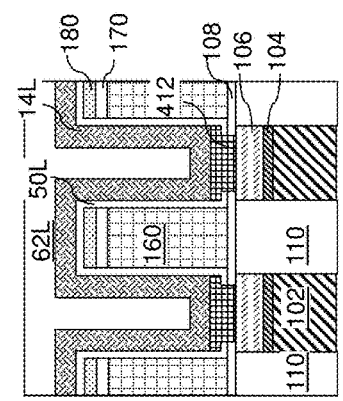
Figure 19D:
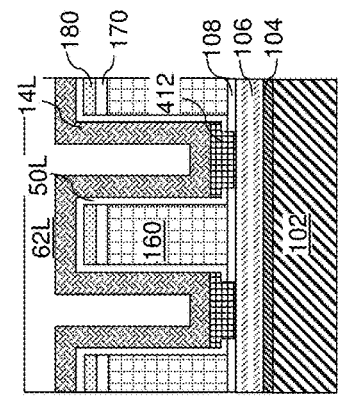

Referring to FIG. 18, a three-dimensional memory array can be formed on the exemplary structure. For example, a plurality of alternating stacks (30, 60) of insulating strips 60 and electrically conductive word line strips 30 can be formed over the two-dimensional array of vertical field effect transistors of the exemplary structures described above. Each layer within an alternating stack (30, 60), i.e., each of the insulating strips 60 and the electrically conductive word line strips 30 in the alternating stack (30, 60), can laterally extend along a horizontal direction, which may be selected from the first horizontal direction hd1 and the second horizontal direction hd2. Each neighboring pair of alternating stacks (30, 60) can be laterally spaced from each other by a line trench. The line trenches can form a one-dimensional array that is repeated along a horizontal direction that is perpendicular to the horizontal direction along which the layers within each alternating stack (30, 60) laterally extend. The line trenches can be filled with a two-dimensional array of dielectric pillar structures that defines a two-dimensional array of pillar cavities (i.e., cavities having a respective pillar shape). Each pillar cavity is laterally bounded by a neighboring pair of alternating stacks (30, 60) along one horizontal direction, and is laterally bounded by a neighboring pair of dielectric pillar structures along another horizontal direction.

Resistive memory elements 80 can be formed on the sidewalls of the pillar cavities, i.e., on the sidewalls of the plurality of alternating stacks (30, 60).

The resistive memory element 80 material may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

Each BMC can include a metal oxide material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$. The memory cell may also include a barrier material, such as amorphous silicon or other suitable barrier materials. An interfacial barrier oxide is located between the metal oxide material and the barrier material. For an amorphous silicon barrier material, the interfacial barrier oxide may comprise silicon oxide.

Without wishing to be bound by a particular theory, it is believed that the BMC ReRAM device operates as follows. The switching mechanism in BMC stack is generally understood as oxygen interstitial (Oi) generation in the interfacial barrier oxide (e.g., $SiO_2$) at the amorphous silicon (a-Si)/$TiO_{2-\delta}$ interface after a RESET operation (i.e., resetting the stack into the high resistivity state, HRS). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface. This re-oxidation decreases the conductivity of the $TiO_{2-\delta}$ material and/or increases the thickness of the insulating interfacial barrier oxide and hence increases the resistance of the BMC memory cell. During the SET operation, opposite voltage is applied across the cell, and Ti—O bonds are supposed to be broken down to generate Oi and Vo (oxygen vacancy) pair in the titanium oxide layer. Oi may drift back to the a-Si/$TiO_{2-\delta}$ interface along the electric field to increase the conductivity of the $TiO_{2-\delta}$ layer and/or decrease the thickness of the insulating interfacial barrier oxide and hence decrease the resistance of the BMC memory cell to set the memory cell into the low resistivity state, LRS.

Without wishing to be bound by a particular theory, it is believed that a BMC ReRAM device may operate based on the principle described above and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide.

Optionally, the resistive memory element 80 may also include an optional steering element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower esistance to the flow of current in one direction, and a higher e stance in the other direction).

Vertical bit lines 90 can be formed in remaining volumes of the pillar cavities. Each vertical bit line 90 can electrically contact a respective one of the top active regions 63, and can be formed between a respective neighboring pair of alternating stacks (30, 60) among the plurality of alternating stacks (30, 60). In one embodiment, the structure formed above the two-dimensional array of vertical field effect transistors can include a three-dimensional array of resistive random access memory (ReRAM) devices.

Generally, resistive memory elements of a resistive random access memory device can be formed on sidewalls of the plurality of alternating stacks (30, 60). Vertical local bit lines 90 contacting a respective one of the top active regions 16 can be formed between a respective neighboring pair of alternating stacks (30, 60) among the plurality of alternating stacks (30, 60).

Referring to FIGS. 19A-19D, an alternative configuration of the exemplary structure is illustrated, which can be derived from the exemplary structure of FIGS. 4A-4D by sequentially forming the gate dielectric layer 50L and the patterning film 53 in each opening of the gate conductor material layer 160. An anisotropic etch process is performed to etch through the bottom portions of the patterning film 53 at the bottom of each opening through the gate conductor material layer 160 and through the insulating spacer layer 108 to expose the doped semiconductor strips 106 similar to the etch process shown in FIGS. 6B and 6D. The patterning film 53 is then removed.

Subsequently, a selective semiconductor deposition process can be performed to grow semiconductor material portions from the top surfaces of the doped semiconductor strips 106. A selective semiconductor deposition process is a deposition process in which a reactant for deposition of a semiconductor material and an etchant for etching the semiconductor material are simultaneously or alternately flowed into a process chamber. Deposition of the semiconductor material proceeds at a higher rate on semiconductor surfaces than on dielectric surfaces. The flow rate of the etchant is selected such that the etch rate is greater than the deposition rate of the semiconductor material on the dielectric surfaces and is less than the deposition rate of the semiconductor material on the semiconductor surfaces. Thus, net deposition of the semiconductor material occurs only on semiconductor surfaces, and the deposited semiconductor material grows only from pre-existing semiconductor surfaces such as the physically exposed surfaces of the doped semiconductor strips 106.

The deposited semiconductor material portions can be in-situ doped with dopants of the first conductivity type to form bottom active regions 412. Alternatively or additionally, dopants of the first conductivity type can be introduced into the deposited semiconductor material portions by ion implantation to form the bottom active regions 412. Thereafter, the processing step of FIGS. 5A-5D and 7A-7D for forming a semiconductor channel layer and 14L a dielectric core material layer 62L can be performed to form a semiconductor channel layer 14L and a dielectric core material layer 62L. The semiconductor channel layer 14L provides the function of the combination of the first and second semiconductor channel layers (214L, 314L) in the exemplary structure described above.

Figure 20:
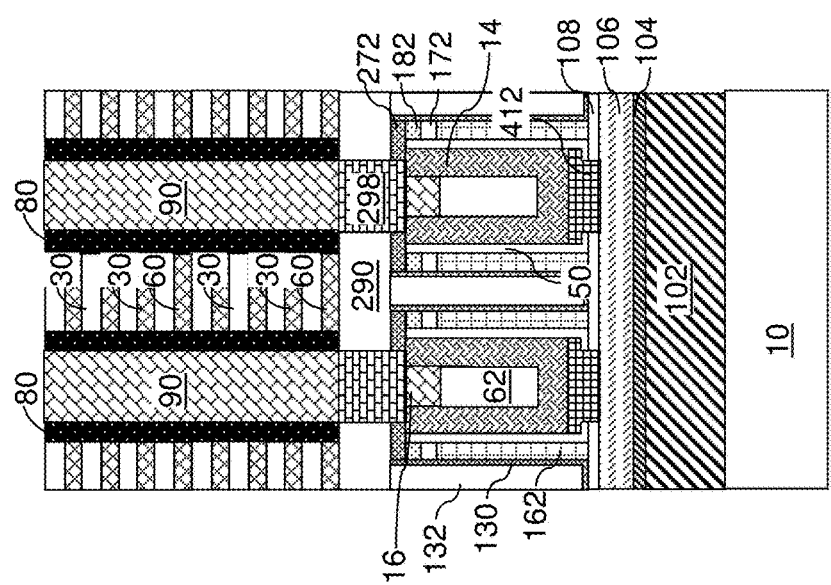
FIG. 20 is a vertical cross-sectional view of the alternative configuration of the exemplary structure after formation of a plurality of alternating stacks of insulating strips and electrically conductive strips over the two-dimensional array of vertical field effect transistors, resistive memory elements, and vertical bit lines according to an embodiment of the present disclosure.

The processing steps of FIGS. 8A-8D, 9A-9D, 10A-10C, 11A-11C, 12A-12C, 13A-13C, 14A-14C, 15A-15C, 16A-16C, and 18 can be subsequently performed to provide the structure illustrated in FIG. 20.

Referring generally to all of the figures of the present disclosure, a semiconductor structure comprising a two-dimensional array of vertical field effect transistors is provided. The two-dimensional array of vertical field effect transistors comprises: a one-dimensional array of gate electrode lines 162 that laterally extend along a first horizontal direction hd1 and laterally spaced among one another along a second horizontal direction hd2, wherein each of the gate electrode lines 162 includes a one-dimensional array of openings arranged along the first horizontal direction hd1, and a sidewall of each of the openings comprises a surface of a respective one of the gate electrode lines 162; a gate dielectric 50 located inside each opening in the gate electrode lines 162; and a vertical semiconductor channel 14 extending along a vertical direction and located inside each opening in the gate electrode lines 162 and laterally surrounded by the gate dielectric 50.

In one embodiment, each opening in the one-dimensional array of openings has a horizontal cross-sectional shape of a circle, an ellipse, or an oval. In one embodiment, the semiconductor structure further comprises gate divider rail structures 132 located between each neighboring pair of gate electrode lines 162 among the one-dimensional array of gate electrode lines 162. In one embodiment, each of the gate divider rail structures 132 has a vertical cross-sectional shape of a rectangle or a trapezoid within vertical planes that are perpendicular to the first horizontal direction hd1.

In one embodiment, the semiconductor structure further comprises: top active regions 16 located at an upper end of a respective one of the vertical semiconductor channels 14; and bottom active regions 12 located at a lower end of a respective one of the vertical semiconductor channels 14. In one embodiment, the semiconductor structure further comprises doped semiconductor strips 106 having a doping of a same conductivity type as the bottom active regions 12, contacting a column of the bottom active regions 12 that are arranged along the second horizontal direction hd2, and laterally spaced among one another along the first horizontal direction hd1.

In one embodiment, the semiconductor structure further comprises a planar insulating spacer layer 108 overlying the doped semiconductor strips 106 and underlying the one-dimensional array of gate electrode lines 162 and including a two-dimensional array of openings. In one embodiment, each of the bottom active regions 12 extends through a respective opening in the two-dimensional array of openings through the planar insulating spacer layer 108. In one embodiment, each of the bottom active regions 12 comprises: an upper portion overlying a horizontal portion of a respective one of the gate dielectrics 50; and a lower portion contacting sidewalls of the horizontal portion of the respective one of the gate dielectrics 50 and having a lesser area than the upper portion.

In one embodiment, each of the gate electrode lines 162 comprises a pair of lengthwise sidewalls that laterally extend along the first horizontal direction hd1 and are laterally spaced from a respective one-dimensional array of openings.

In one embodiment, the semiconductor structure can further comprise a one-dimensional array of dielectric cap strips (172 or 182) overlying the one-dimensional array of gate electrode lines 162, wherein sidewalls of the dielectric cap strips (172, 182) are vertically coincident with sidewalls of a respective underlying one of the gate electrode lines 162.

In one embodiment, the semiconductor structure can further comprise an alternating sequence of conductive rails 102 comprising global bit lines and dielectric separator rails 110 that alternate along the second horizontal direction hd2, wherein each of the conductive rails 102 is electrically connected to a respective column of bottom active regions 61 that are arranged along the second horizontal direction hd2.

In one embodiment, the semiconductor structure can further comprise a ReRAM device. The ReRAM device comprises a plurality of alternating stacks (30, 60) of insulating strips 60 and electrically conductive word line strips 30 overlying the two-dimensional array of vertical field effect transistors, wherein each of the insulating strips 60 and the electrically conductive word line strips 30 laterally extend along a horizontal direction that is selected from the first horizontal direction hd1 and the second horizontal direction hd2; vertical local bit lines 90 contacting a respective one of the top active regions 63 and vertically extending between a respective neighboring pair of alternating stacks (30, 60) among the plurality of alternating stacks (30, 60); and resistive memory elements 80 located at each intersection between the vertical local bit lines 90 and the plurality of alternating stacks (30, 60).

The vertical semiconductor channels 14 of the vertical field effect transistors are located entirely within a respective one of the openings in the gate electrode lines 52. As such, each vertical field effect transistor includes a respective surround gate providing increased gate length and on current as well as enhanced control of channel mobility compared to vertical field effect transistors including only a pair of gate electrodes on respective two sidewalls of a rectangular semiconductor channel. Further, the vertical field effect transistors including the surrounding gates can provide enhanced sub-threshold voltage characteristics, thereby improving many device characteristics for a three-dimensional memory device. Furthermore, the circle type surround gate etch is believed to reduce the etching damage compared to dual x-direction and y-direction etches.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a two-dimensional array of vertical field effect transistors, wherein the two-dimensional array of vertical field effect transistors comprises:
   a one-dimensional array of gate electrode lines that laterally extend along a first horizontal direction and laterally spaced among one another along a second horizontal direction, wherein each of the gate electrode lines includes a one-dimensional array of openings arranged along the first horizontal direction;
   a gate dielectric located inside each opening in the gate electrode lines;
   a vertical semiconductor channel extending along a vertical direction and located inside each opening in the gate electrode lines and laterally surrounded by the gate dielectric; and
   gate divider rail structures located between each neighboring pair of gate electrode lines among the one-dimensional array of gate electrode lines,
   wherein a sidewall of each of the openings comprises a surface of a respective one of the gate electrode lines and each opening in the one-dimensional array of openings has a horizontal cross-sectional shape of a circle, an ellipse, or an oval.

2. The semiconductor structure of claim 1, wherein each of the gate divider rail structures has a vertical cross-sectional shape of a rectangle or a trapezoid within vertical planes that are perpendicular to the first horizontal direction.

3. The semiconductor structure of claim 1, wherein each of the gate electrode lines comprises a pair of lengthwise sidewalls that laterally extend along the first horizontal direction and are laterally spaced from a respective one-dimensional array of openings.

4. The semiconductor structure of claim 1, further comprising a one-dimensional array of dielectric cap strips overlying the one-dimensional array of gate electrode lines, wherein sidewalls of the dielectric cap strips are vertically coincident with sidewalls of a respective underlying one of the gate electrode lines.

5. The semiconductor structure of claim 1, further comprising:
   top active regions located at an upper end of a respective one of the vertical semiconductor channels; and
   bottom active regions located at a lower end of a respective one of the vertical semiconductor channels.

6. The semiconductor structure of claim 5, further comprising doped semiconductor strips having a doping of a same conductivity type as the bottom active regions, contacting a column of the bottom active regions that are arranged along the second horizontal direction, and laterally spaced among one another along the first horizontal direction.

7. The semiconductor structure of claim 6, further comprising a planar insulating spacer layer overlying the doped semiconductor strips and underlying the one-dimensional array of gate electrode lines and including a two-dimensional array of openings.

8. The semiconductor structure of claim 7, wherein each of the bottom active regions extends through a respective opening in the two-dimensional array of openings through the planar insulating spacer layer.

9. A semiconductor structure comprising a two-dimensional array of vertical field effect transistors, wherein the two-dimensional array of vertical field effect transistors comprises:
   a one-dimensional array of gate electrode lines that laterally extend along a first horizontal direction and laterally spaced among one another along a second horizontal direction, wherein each of the gate electrode lines includes a one-dimensional array of openings arranged along the first horizontal direction, and a sidewall of each of the openings comprises a surface of a respective one of the gate electrode lines;
   a gate dielectric located inside each opening in the gate electrode lines;
   a vertical semiconductor channel extending along a vertical direction and located inside each opening in the gate electrode lines and laterally surrounded by the gate dielectric;
   top active regions located at an upper end of a respective one of the vertical semiconductor channels; and
   bottom active regions located at a lower end of a respective one of the vertical semiconductor channels;
   wherein each of the bottom active regions comprises:
   an upper portion overlying a horizontal portion of a respective one of the gate dielectrics; and
   a lower portion contacting sidewalls of the horizontal portion of the respective one of the gate dielectrics and having a lesser area than the upper portion.

10. A semiconductor structure comprising a two-dimensional array of vertical field effect transistors, wherein the two-dimensional array of vertical field effect transistors comprises:
    a one-dimensional array of gate electrode lines that laterally extend along a first horizontal direction and laterally spaced among one another along a second horizontal direction, wherein each of the gate electrode lines includes a one-dimensional array of openings arranged along the first horizontal direction, and a sidewall of each of the openings comprises a surface of a respective one of the gate electrode lines;
    a gate dielectric located inside each opening in the gate electrode lines;
    a vertical semiconductor channel extending along a vertical direction and located inside each opening in the gate electrode lines and laterally surrounded by the gate dielectric; and
    an alternating sequence of conductive rails and dielectric separator rails that alternate along the first horizontal direction, wherein each of the conductive rails is electrically connected to a respective column of bottom active regions that are arranged along the second horizontal direction and contact a respective one of the vertical semiconductor channels.

11. The semiconductor structure of claim 10, further comprising a resistive random access memory (ReRAM) device located over the two dimensional array of vertical field effect transistors, the ReRAM device comprising:
    a plurality of alternating stacks of insulating strips and electrically conductive word line strips overlying the two-dimensional array of vertical field effect transistors;
    vertical local bit lines electrically contacting a respective one of the top active regions and vertically extending between a respective neighboring pair of alternating stacks among the plurality of alternating stacks; and resistive memory elements located at each intersection between the vertical local bit lines and the plurality of alternating stacks.

12. A method of forming a semiconductor structure, comprising:
   forming doped semiconductor strips laterally spaced apart along a first horizontal direction and laterally extending along a second horizontal direction over a substrate;
   forming a planar insulating spacer layer, a gate conductor material layer, and a dielectric cap layer over the doped semiconductor strips;
   forming a two-dimensional array of openings through the dielectric cap layer and the gate electrode material layer;
   forming gate dielectrics in the two-dimensional array of openings;
   forming vertical semiconductor channels on each of the gate dielectrics by deposition of a semiconductor material; and
   forming gate divider rail structures through the gate conductor material layer, wherein the gate divider rail structures laterally extend along the first horizontal direction and divide the gate conductor material layer into a one-dimensional array of gate electrode lines.

13. The method of claim 12, wherein the gate divider rail structures are formed by:
   forming gate divider trenches through the dielectric cap layer and the gate electrode material layer and between neighboring rows of openings in the gate electrode material layer that are arranged along the first horizontal direction; and
   depositing a dielectric material in the gate divider trenches.

14. The method of claim 12, wherein the vertical semiconductor channels are formed by:
   depositing a first semiconductor channel layer on the gate dielectrics;
   removing horizontal portions of the first semiconductor channel layer and the planar insulating spacer layer underlying the two-dimensional array of openings; and
   depositing a second semiconductor channel layer on physically exposed portions of the doped semiconductor strips and the first semiconductor channel layer, wherein each of the vertical semiconductor channels comprises a portion of the first semiconductor channel layer and a portion of the second semiconductor channel layer.

15. The method of claim 12, further comprising:
   forming top active regions having a doping of the first conductivity type over the vertical semiconductor channels; and
   forming bottom active regions by diffusing dopants of the first conductivity type from the doped semiconductor strips into lower portions of the vertical semiconductor channels.

16. The method of claim 12, further comprising forming contact via structures on the gate electrode lines and metal interconnect structures located under the doped semiconductor strips, wherein at least one of the contact via structures is formed directly on a sidewall of a respective one of the gate electrode lines and directly on a top surface of a respective one of the metal interconnect structures.

17. The method of claim 12, further comprising forming an alternating sequence of conductive rails and dielectric separator rails that alternate along the first horizontal direction over the substrate, wherein each of the doped semiconductor strips is formed on a top surface of a respective one of the conductive rails.

18. The method of claim 17, further comprising:
   forming a plurality of alternating stacks of insulating strips and electrically conductive word line strips overlying the two-dimensional array of vertical field effect transistors;
   forming resistive memory elements of a resistive random access memory device on sidewalls of the plurality of alternating stacks; and
   forming vertical local bit lines contacting a respective one of the top active regions between a respective neighboring pair of alternating stacks among the plurality of alternating stacks.

* * * * *